US012745507B2

(12) United States Patent
Lee et al.

(10) Patent No.: US 12,745,507 B2
(45) Date of Patent: Sep. 22, 2026

(54) QUANTUM DOT DEVICE AND ELECTRONIC DEVICE

(71) Applicant: SAMSUNG ELECTRONICS CO., LTD., Suwon-si (KR)

(72) Inventors: Dae-Hee Lee, Hwaseong-si (KR); Yeonkyung Lee, Seongnam-si (KR); Tae Hyung Kim, Seoul (KR); Heejae Lee, Seongnam-si (KR); Eun Joo Jang, Suwon-si (KR); Dae Young Chung, Suwon-si (KR); Soonmin Cha, Suwon-si (KR)

(73) Assignees: SAMSUNG ELECTRONICS CO., LTD., Gyeonggi-Do (KR); SAMSUNG DISPLAY CO., LTD., Gyeonggi-Do (KR)

( * ) Notice: Subject to any disclaimer, the term of this patent is extended or adjusted under 35 U.S.C. 154(b) by 903 days.

(21) Appl. No.: 17/495,162

(22) Filed: Oct. 6, 2021

(65) Prior Publication Data

US 2022/0310956 A1 Sep. 29, 2022

(30) Foreign Application Priority Data

Mar. 26, 2021 (KR) ........................ 10-2021-0039654

(51) Int. Cl.

| | |
|---|---|
| ***H10K 50/11*** | (2023.01) |
| ***H10K 50/115*** | (2023.01) |
| ***H10K 50/15*** | (2023.01) |
| ***H10K 85/10*** | (2023.01) |
| ***H10K 101/30*** | (2023.01) |
| ***H10K 101/40*** | (2023.01) |

(52) U.S. Cl.

CPC ........... *H10K 50/11* (2023.02); *H10K 50/115* (2023.02); *H10K 50/15* (2023.02); *H10K 85/10* (2023.02); *H10K 2101/30* (2023.02); *H10K 2101/40* (2023.02)

(58) Field of Classification Search

CPC .... H05K 50/115; H10K 50/11; H10K 50/115; H10K 50/15; H10K 2101/30; H10K 2101/40; H10K 85/111

See application file for complete search history.

(56) References Cited

U.S. PATENT DOCUMENTS

| | | | |
|---|---|---|---|
| 8,183,762 | B2 | 5/2012 | Kim et al. |
| 10,944,067 | B2 | 3/2021 | Kang et al. |
| 10,978,657 | B2 | 4/2021 | Kim et al. |
| 11,569,468 | B2 | 1/2023 | Kim et al. |
| 11,659,725 | B2 | 5/2023 | Lee et al. |
| 11,800,733 | B2 | 10/2023 | Cho et al. |
| 12,041,802 | B2 | 7/2024 | Kim et al. |
| 12,193,252 | B2 | 1/2025 | Lee et al. |
| 2011/0101398 | A1* | 5/2011 | Uchida .................. H10K 59/35 257/98 |
| 2013/0104987 | A1* | 5/2013 | Wang .................. H10K 30/211 136/263 |
| 2016/0204370 | A1* | 7/2016 | Park ....................... H10K 50/18 438/46 |
| 2018/0286923 | A1* | 10/2018 | Fischer ..................... B28B 3/00 |
| 2019/0280230 | A1 | 9/2019 | Seo et al. |
| 2020/0083470 | A1* | 3/2020 | Chung ................... H10K 71/00 |
| 2020/0212306 | A1 | 7/2020 | Konishi et al. |

FOREIGN PATENT DOCUMENTS

| | | | |
|---|---|---|---|
| CN | 109004091 | A | 12/2018 |
| KR | 20120050146 | A | 5/2012 |
| KR | 20120061000 | A | 6/2012 |
| KR | 101479652 | B1 | 1/2015 |
| KR | 20190063544 | A | 6/2019 |
| KR | 20190106770 | A | 9/2019 |
| KR | 20200023243 | A | 3/2020 |
| KR | 20200041712 | A | 4/2020 |
| KR | 20200059579 | A | 5/2020 |
| KR | 20200083925 | A | 7/2020 |
| KR | 20210004748 | A | 1/2021 |

OTHER PUBLICATIONS

Ho, Polymer and Small Molecule Mixture for Organic Hole Transport Layers in Quantum Dot Light-Emitting Diodes, 2013, ACS Applied Materials & Interfaces, 5, pp. 12369-12374. (Year: 2013).*

Lin, Enhanced Performance of Green Perovskite Quantum Dots Light-Emitting Diode Based on Co-Doped Polymers as Hole Transport Layer, 2019, IEEE Electron Device Letters, vol. 40, No. 9, pp. 1479-1482. (Year: 2019).*

Huang, High-performance quantum dot light-emitting diodes with hybrid hole transport layer via doping engineering, 2016, Optic Express, vol. 24, No. 23, pp. 25955-25963. (Year: 2016).*

Lin, Cadmium-free quantum dots based violet light emitting diodes: High-efficiency and brightness via optimization of organic hole transport layers, 2015, Organic Electronics 25, pp. 178-183. (Year: 2015).*

Wang, Achieving Balanced Charge Injection of Blue Quantum Dot Light-Emitting Diodes through Transport Layer Doping Strategies, 2019, J. Phys. Chem. Lett., 10, pp. 960-965. (Year: 2019).*

(Continued)

*Primary Examiner* — Monique R Jackson

(74) *Attorney, Agent, or Firm* — CANTOR COLBURN LLP

(57) ABSTRACT

A quantum dot quantum dot device includes a first electrode and a second electrode, a light emitting layer disposed between the first electrode and the second electrode and including quantum dots, and a first hole auxiliary layer between the first electrode and the light emitting layer, wherein the first hole auxiliary layer includes a first hole auxiliary material and a second hole auxiliary material having a greater bandgap energy than a bandgap energy of the first hole auxiliary material, a difference between a HOMO energy level of the second hole auxiliary material and a HOMO energy level of the first hole auxiliary material is about 0.1 eV and less than about 0.8 eV, and a difference between a LUMO energy level of the second hole auxiliary material and a LUMO energy level of the first hole auxiliary material is greater than or equal to about 0.3 eV.

17 Claims, 1 Drawing Sheet

(56) References Cited

OTHER PUBLICATIONS

Tang, Realizing 22.3% EQE and 7-Fold Lifetime Enhancement in QLEDs via Blending Polymer TFB and Cross-Linkable Small Molecules for a Solvent-Resistant Hole Transport Layer, 2020, ACS Applied Materials & Interfaces, 12, pp. 13087-13095. (Year: 2020).*
Zhang, All-solution processed composite hole transport layer for quantum dot light emitting diode, 2016, Thin Film Solids 603, pp. 187-192. (Year: 2016).*
Zhao, Composite Hole Transport Layer Consisting of High-Mobility Polymer and Small Molecule With Deep-Lying HOMO Level for Efficient Quantum Dot Light-Emitting Diodes, 2020, IEEE Electron Device Letters, vol. 41, No. 1, pp. 80-83. (Year: 2020).*
Machine translation of KR20120050146A, published May 2012, Powered by EPO and Google. (Year: 2012).*
Sigma-Aldrich, TFB Product No. 901101, Product Information webpage, retrieved on Sep. 19, 2025 from <https://www.sigmaaldrich.com/US/en/product/aldrich/901101>. (Year: 2025).*
Google Search results for "tfb hole transport material" retrieved on Sep. 19, 2025. (Year: 2025).*
Google Search results for Poly[N, N'-bis(4-butylphenyl)-N, N'-5.4 bisphenylbenzidine] (Poly-TPD) retrieved on Sep. 19, 2025. (Year: 2025).*
Office Action dated Nov. 11, 2024 of the corresponding Korean Patent Application No. 10-2021-0039654.

* cited by examiner

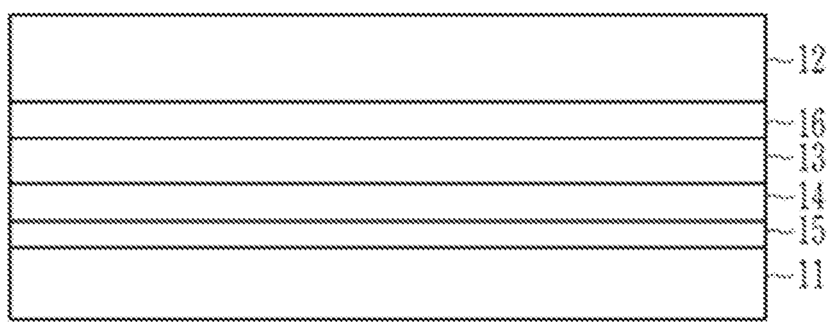
10
12
16
13
14
15
11

QUANTUM DOT DEVICE AND ELECTRONIC DEVICE

CROSS-REFERENCE TO RELATED APPLICATION

This application claims priority to and the benefit of Korean Patent Application No. 10-2021-0039654 filed in the Korean Intellectual Property Office on Mar. 26, 2021, and all the benefits accruing therefrom under 35 U.S.C. § 119, the content of which in its entirety is herein incorporated by reference.

BACKGROUND

1. Field

A quantum dot device and an electronic device are disclosed.

2. Description of the Related Art

Semiconductor nanocrystals also known as quantum dots, when supplied with photoenergy or electrical energy, may be configured to emit light of a wavelength corresponding to sizes of the quantum dots. Accordingly, the quantum dots may be used as a light emitter, emitting light of a particular wavelength.

Research on a quantum dot device using the quantum dots as a light emitter is of recent interest, and thus a new method of improving the performance of a quantum dot device is of importance.

SUMMARY

An embodiment provides a quantum dot device capable of realizing improved performance.

An embodiment provides an electronic device including the quantum dot device.

According to an embodiment, a quantum dot device includes a first electrode and a second electrode, a light emitting layer between the first electrode and the second electrode and including quantum dots, and a first hole auxiliary layer between the first electrode and the light emitting layer, wherein the first hole auxiliary layer includes a first hole auxiliary material and a second hole auxiliary material having a greater bandgap energy than a bandgap energy of the first hole auxiliary material, a difference between a highest occupied molecular orbital (HOMO) energy level of the second hole auxiliary material and a HOMO energy level of the first hole auxiliary material is greater than or equal to about 0.1 electronvolts (eV) and less than about 0.8 eV, and a difference between a lowest unoccupied molecular orbital (LUMO) energy level of the second hole auxiliary material and a LUMO energy level of the first hole auxiliary material is greater than or equal to about 0.3 eV.

The first hole auxiliary material and the second hole auxiliary material may be blended in the first hole auxiliary layer.

The HOMO energy level of the first hole auxiliary material may be between a work function of the first electrode and a HOMO energy level of the light emitting layer, the HOMO energy level of the second hole auxiliary material may be between the work function of the first electrode and the HOMO energy level of the light emitting layer.

The HOMO energy level of the second hole auxiliary material may be less than the HOMO energy level of the first hole auxiliary material, and the LUMO energy level of the second hole auxiliary material may be less than the LUMO energy level of the first hole auxiliary material.

The HOMO energy level of the first hole auxiliary material may be about 5.1 eV to about 6.0 eV, and the HOMO energy level of the second hole auxiliary material may be greater than or equal to about 4.8 eV and less than about 5.4 eV.

The LUMO energy level of the first hole auxiliary material may be about 2.0 eV to about 2.8 eV, and the LUMO energy level of the second hole auxiliary material may be about 1.2 eV to about 2.0 eV.

The bandgap energy of the second hole auxiliary material may be about 0.5 eV to about 1.2 eV greater than the bandgap energy of the first hole auxiliary material.

The HOMO energy level of the second hole auxiliary material may be greater than or equal to about 5.0 eV and less than about 5.4 eV, and the LUMO energy level of the second hole auxiliary material may be about 1.5 eV to about 1.9 eV.

The bandgap energy of the second hole auxiliary material may be greater than or equal to about 3.0 eV.

Each of the first hole auxiliary material and the second hole auxiliary material may be a semiconductor polymer.

The first hole auxiliary material and the second hole auxiliary material may be soluble in the same solvent.

The second hole auxiliary material may be an amine polymer.

The first hole auxiliary layer may include less of the second hole auxiliary material than the first hole auxiliary material.

A mole ratio of the second hole auxiliary material to the first hole auxiliary material in the first hole auxiliary layer may be about 0.01:1 to about 0.8:1.

The quantum dot device may further include a second hole auxiliary layer between the first electrode and the first hole auxiliary layer.

According to an embodiment, a quantum dot device includes a first electrode and a second electrode, a light emitting layer between the first electrode and the second electrode and including quantum dots, a first hole auxiliary layer between the first electrode and the light emitting layer and including a mixture of a first hole auxiliary material and a second hole auxiliary material, and a second hole auxiliary layer the first electrode and the first hole auxiliary layer, wherein the first hole auxiliary layer includes less of the second hole auxiliary material than the first hole auxiliary material, a HOMO energy level of the second hole auxiliary material may be greater than or equal to about 5.0 eV and less than about 5.4 eV, and a LUMO energy level of the second hole auxiliary material may be about 1.5 eV to about 1.9 eV.

The HOMO energy level of the first hole auxiliary material may be about 5.1 eV to about 6.0 eV and the LUMO energy level of the second hole auxiliary material may be about 2.0 eV to about 2.8 eV.

Each of the first hole auxiliary material and the second hole auxiliary material may be a semiconductor polymer, and the second hole auxiliary material may be an amine polymer.

In the first hole auxiliary layer, a mole ratio of the first hole auxiliary material and the second hole auxiliary material may be about 2:1 to about 5:1.

According to an embodiment, an electronic device including the quantum dot device is provided.

The performance of quantum dot devices may be improved.

BRIEF DESCRIPTION OF THE DRAWINGS

The above and other advantages and features of this disclosure will become more apparent by describing in further detail exemplary embodiments thereof with reference to the accompanying drawings, in which:

The FIGURE is a schematic cross-sectional view illustrating a quantum dot device according to an embodiment.

DETAILED DESCRIPTION

Hereinafter, example embodiments of the present disclosure will be described in detail so that a person skilled in the art would understand the same. This disclosure may, however, be embodied in many different forms and is not construed as limited to the example embodiments set forth herein.

In the drawings, the thickness of layers, films, panels, regions, etc., are exaggerated for clarity. Like reference numerals designate like elements throughout the specification. It will be understood that when an element such as a layer, film, region, or substrate is referred to as being "on" another element, it can be directly on the other element or intervening elements may also be present. In contrast, when an element is referred to as being "directly on" another element, there are no intervening elements present.

It will be understood that, although the terms "first," "second," "third," etc. may be used herein to describe various elements, components, regions, layers, and/or sections, these elements, components, regions, layers and/or sections should not be limited by these terms. These terms are only used to distinguish one element, component, region, layer, or section from another element, component, region, layer, or section. Thus, "a first element," "component," "region," "layer," or "section" discussed below could be termed a second element, component, region, layer, or section without departing from the teachings herein.

The terminology used herein is for the purpose of describing particular embodiments only and is not intended to be limiting. As used herein, "a", "an," "the," and "at least one" do not denote a limitation of quantity, and are intended to include both the singular and plural, unless the context clearly indicates otherwise. For example, "an element" has the same meaning as "at least one element," unless the context clearly indicates otherwise. "At least one" is not to be construed as limiting "a" or "an." "or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the FIGURES. It will be understood that relative terms are intended to encompass different orientations of the device in addition to the orientation depicted in the FIGURES. For example, if the device in one of the FIGURES is turned over, elements described as being on the "lower" side of other elements would then be oriented on "upper" sides of the other elements. The exemplary term "lower," can therefore, encompasses both an orientation of "lower" and "upper," depending on the particular orientation of the FIGURE. Similarly, if the device in one of the FIGURES is turned over, elements described as "below" or "beneath" other elements would then be oriented "above" the other elements. The exemplary terms "below" or "beneath" can, therefore, encompass both an orientation of above and below.

"About" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10% or 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Hereinafter, the term "combination" includes a mixture and a laminated structure of two or more.

As used herein, when specific definition is not otherwise provided, an energy level refers to the highest occupied molecular orbital (HOMO) energy level and the lowest unoccupied molecular orbital (LUMO) energy level.

Hereinafter, a work function, a HOMO energy level, or a LUMO energy level is expressed as an absolute value from a vacuum level. In addition, when the work function, HOMO energy level, or LUMO energy level is referred to be deep, high, or large, it may have a large absolute value based on "0 eV" of the vacuum level while when the work function, HOMO energy level, or LUMO energy level is referred to be shallow, low, or small, it may have a small absolute value based on "0 eV" of the vacuum level.

The HOMO energy level and work function may be measured by ultraviolet photoelectron spectroscopy (UPS), and the LUMO energy level may be calculated from the bandgap energy obtained at the absorption peak and the HOMO energy level.

As used herein, the expression "not including cadmium (or other harmful heavy metal)" refers to the case in which a concentration of the cadmium (or the harmful heavy metal) may be less than or equal to about 100 parts per million by weight (ppmw), less than or equal to about 50 ppmw, less than or equal to about 10 ppmw, or zero ppmw. In an embodiment, substantially no cadmium (or other heavy metal) may be present or, if present, an amount of the cadmium (or other heavy metal) may be less than or equal to a detection limit or as an impurity level of a given analysis tool.

As used herein, "Group" in terms of Group II, Group III, etc. refers to a group of the periodic table of elements.

As used herein, "Group I" may refer to Group IA and Group IB and examples of the Group I element may be Li, Na, K, Rb, or Cs but are not limited thereto.

As used herein, "Group II" may refer to Group IIA and Group IIB, and examples of Group II metal may be Cd, Zn, Hg, and Mg, but are not limited thereto.

As used herein, "Group III" may refer to Group IIIA and Group IIIB, and examples of Group III metal may be Al, In, Ga, and TI, but are not limited thereto.

As used herein, "Group IV" may refer to Group IVA and Group IVB, and examples of a Group IV metal may be Si, Ge, and Sn, but are not limited thereto. As used herein, the term "metal" may include a semi-metal such as Si.

As used herein, "Group V" may refer to Group VA, and examples may include nitrogen, phosphorus, arsenic, antimony, and bismuth, but are not limited thereto.

As used herein, "Group VI" may refer to Group VIA, and examples may include sulfur, selenium, and tellurium, but are not limited thereto.

Hereinafter, a quantum dot device according to an embodiment is described with reference to the drawings.

The quantum dot device according to an embodiment may be a quantum dot electroluminescent device configured to emit light from the quantum dot by applying an electric field to electrodes.

The FIGURE is a schematic cross-sectional view illustrating a quantum dot device according to an embodiment.

Referring to the FIGURE, a quantum dot device 10 according to an embodiment includes a first electrode 11 and a second electrode 12 facing each other; a light emitting layer 13 between the first electrode 11 and the second electrode 12; a first hole auxiliary layer 14 and a second hole auxiliary layer 15 between the first electrode 11 and the light emitting layer 13; and an electron auxiliary layer 16 between the second electrode 12 and the light emitting layer 13.

The substrate (not shown) may be disposed under the first electrode 11 or may be disposed on the second electrode 12. The substrate may be, for example, made of an inorganic material such as glass; an organic material such as polycarbonate, polymethylmethacrylate, polyethylene terephthalate, polyethylenenaphthalate, polyamide, polyethersulfone, or a combination thereof; or a silicon wafer. The substrate may be omitted.

One of the first electrode 11 and the second electrode 12 is an anode and the other is a cathode. For example, the first electrode 11 may be an anode and the second electrode 12 may be a cathode. For example, the first electrode 11 may be a cathode and the second electrode 12 may be an anode.

The first electrode 11 may be made of a conductor having a relatively high work function, for example, a metal, a conductive metal oxide, or a combination thereof. The first electrode 11 may be made of, for example, a metal or an alloy thereof such as nickel, platinum, vanadium, chromium, copper, zinc, or gold; a conductive metal oxide such as zinc oxide, indium oxide, tin oxide, indium tin oxide (ITO), indium zinc oxide (IZO), or a fluorine-doped tin oxide; or a combination of metal and oxide such as ZnO and Al or $SnO_2$ and Sb, but is not limited thereto.

The second electrode 12 may be made of a conductor having a lower work function than the first electrode 11, and may be made of, for example, a metal, a conductive metal oxide, a conductive polymer, or a combination thereof. The second electrode 12 may include, for example, a metal such as aluminum, magnesium, calcium, sodium, potassium, titanium, indium, yttrium, lithium, gadolinium, silver, tin, lead, cesium, barium, or an alloy thereof; and a multilayer structure material such as LiF/Al, $Li_2O$/Al, Liq/Al, LiF/Ca, and $BaF_2$/Ca, but is not limited thereto.

A work function of the first electrode 11 may be higher, e.g., greater, than a work function of the second electrode 12, for example the work function of the first electrode 11 may be, for example, about 4.5 eV to about 5.0 eV and the work function of the second electrode 12 may be about 4.0 eV to about 4.7 eV. Within the disclosed range, the work function of the first electrode 11 may be, for example, about 4.6 eV to about 4.9 eV, and the work function of the second electrode 12 may be, for example, about 4.0 eV to about 4.5 eV.

The first electrode 11, the second electrode 12, or a combination thereof may be a light-transmitting electrode and the light-transmitting electrode may be for example made of a conductive oxide such as a zinc oxide, indium oxide, tin oxide, indium tin oxide (ITO), indium zinc oxide (IZO), or fluorine doped tin oxide, or a metal thin layer of a single layer or a multilayer. One of the first electrode 11 and the second electrode 12 may be an opaque electrode, and the opaque electrode may be made of, for example, an opaque conductor such as aluminum (Al), silver (Ag), or gold (Au).

The light emitting layer 13 includes a quantum dot (e.g., quantum dots, hereinafter referred to as quantum dot) as a light emitter configured to emit light by an electric field. The quantum dot may mean a semiconductor nanocrystal in a broad sense, and may exhibit a quantum confinement effect. Here, the quantum dot may have any suitable shape, and are not particularly limited. In one non-limiting example, the quantum dot may have various shapes, such as a spherical semiconductor nanocrystal, a quantum rod, a quantum plate, or a combination thereof. Here, the quantum rod may mean a quantum dot having an aspect ratio greater than about 1:1, for example, an aspect ratio of greater than or equal to about 2:1, greater than or equal to about 3:1, or greater than or equal to about 5:1. For example, an aspect ratio of the quantum rod may be less than or equal to about 50:1, less than or equal to about 30, or less than or equal to about 20:1.

The quantum dot may have, for example a particle diameter (an average largest particle diameter for a non-spherical shape) of about 1 nanometer (nm) to about 100 nm, for example, about 1 nm to about 80 nm, for example, about 1 nm to about 50 nm, for example, about 1 nm to about 20 nm. In an example, the (average) size (dimension) of the quantum dot(s) may be greater than or equal to about 1 nm, greater than or equal to about 2 nm, greater than or equal to about 3 nm, greater than or equal to about 4 nm, greater than or equal to about 5 nm, greater than or equal to about 6 nm, greater than or equal to about 7 nm, greater than or equal to about 8 nm, greater than or equal to about 9 nm, greater than or equal to about 10 nm, greater than or equal to about 11 nm, or greater than or equal to about 12 nm. In an example, the (average) size (dimension) of the quantum dot(s) may be less than or equal to about 50 nm, less than or equal to about 40 nm, less than or equal to about 30 nm, less than or equal to about 25 nm, less than or equal to about 20 nm, less than or equal to about 19 nm, less than or equal to about 18 nm, less than or equal to about 17 nm, less than or equal to about 16 nm, or less than or equal to about 15 nm. For example, the average size of quantum dot (e.g., emitting blue light)

may be, for example, less than or equal to about 4.5 nm, for example, less than or equal to about 4.3 nm, less than or equal to about 4.2 nm, less than or equal to about 4.1 nm, or less than or equal to about 4.0 nm. In an example, the (average) size of the quantum dot (e.g., emitting blue light) may be about 2.0 nm to about 4.5 nm, about 2.0 nm to about 4.3 nm, about 2.0 nm to about 4.2 nm, about 2.0 nm to about 4.1 nm, or about 2.0 nm to about 4.0 nm.

A bandgap energy of the quantum dot may be affected by or dependent on to a size of the quantum dot, a composition of the quantum dot, or a combination thereof, and an emission wavelength of the quantum dot may be adjusted accordingly. For example, as the size of a quantum dot is made larger, e.g., is increased, a bandgap energy of the quantum dot may become narrower, e.g., decrease, and thus, light of a relatively long wavelength spectrum may be emitted. As the size of a quantum dot is made smaller, e.g., is decreased, a bandgap energy of the quantum dot may become wider, e.g., increase, and thus light of a relatively short wavelength spectrum may be emitted.

For example, the quantum dot may be configured to emit light of, for example, a predetermined wavelength spectrum in the visible ray according to a size, composition, or a combination thereof of the quantum dot. For example, quantum dots may be configured to emit blue light, red light or green light, blue light may have a peak emission wavelength in a wavelength range of about 430 nm to about 480 nm, red light may have a peak emission wavelength in a wavelength range of about 600 nm to about 670 nm, and green light may have a peak emission wavelength in a wavelength range of about 520 nm to about 560 nm.

In the quantum dot device 10 of an example, a maximum emission wavelength of the light emitting layer 13 may be greater than or equal to about 300 nm, greater than or equal to about 400 nm, greater than or equal to about 430 nm, greater than or equal to about 450 nm, for example, greater than or equal to about 500 nm, greater than or equal to about 510 nm, greater than or equal to about 520 nm, greater than or equal to about 530 nm, greater than or equal to about 540 nm, greater than or equal to about 550 nm, greater than or equal to about 560 nm, greater than or equal to about 570 nm, greater than or equal to about 580 nm, greater than or equal to about 590 nm, greater than or equal to about 600 nm, or greater than or equal to about 610 nm. The maximum emission wavelength of the quantum dot may be in the range of less than or equal to about 800 nm, less than or equal to about 780 nm, less than or equal to about 750 nm, for example, about 700 nm, less than or equal to about 670 nm, less than or equal to about 650 nm, less than or equal to about 640 nm, less than or equal to about 630 nm, less than or equal to about 620 nm, less than or equal to about 610 nm, less than or equal to about 600 nm, less than or equal to about 590 nm, less than or equal to about 580 nm, less than or equal to about 570 nm, less than or equal to about 560 nm, less than or equal to about 550 nm, or less than or equal to about 540 nm. The maximum emission wavelength of the quantum dots may be in the range of about 430 nm to about 670 nm.

In the quantum dot device 10 of an example, the light emitting layer 13 or quantum dot(s) may be configured to emit green light, and the maximum emission wavelength may be in the range of greater than or equal to about 500 nm (e.g., greater than or equal to about 510 nm or greater than or equal to about 520 nm) and less than or equal to about 560 nm (e.g., less than or equal to about 550 nm or less than or equal to about 540 nm). In the quantum dot device 10 of an example, the light emitting layer 13 or quantum dot(s) may be configured to emit red light and the maximum emission wavelength may be in the range of greater than or equal to about 600 nm (e.g., may be greater than or equal to about 610 nm) and less than or equal to about 670 nm (e.g., less than or equal to about 650 nm or less than or equal to about 640 nm). In the quantum dot device 10 of an example, the light emitting layer 13 or quantum dot(s) may be configured to emit blue light and the maximum emission wavelength may be in the range of greater than or equal to about 430 nm (e.g., greater than or equal to about 440 nm or greater than or equal to about 450 nm) and less than or equal to about 480 nm (e.g., less than or equal to about 470 nm or less than or equal to about 465 nm).

The quantum dot may have a quantum yield of greater than or equal to about 10%, within the range, for example, greater than or equal to about 20%, greater than or equal to about 30%, greater than or equal to about 50%, greater than or equal to about 60%, greater than or equal to about 70%, or greater than or equal to about 90%.

In an embodiment, "quantum yield" may be a ratio of photons emitted to photons absorbed, e.g., by a nanostructure (a quantum dot) or population of nanostructures (quantum dots). A quantum yield may be measured, for example, in a solution state or a solid state (e.g., in a composite). In an embodiment, the quantum yield may be determined by any suitable method. For example, there may be two methods for measuring the fluorescence quantum yield or efficiency: the absolute method and the relative method. The absolute method directly obtains the quantum yield by detecting all sample fluorescence through the use of an integrating sphere. In the relative method, the fluorescence intensity of a standard sample (e.g., a standard dye) may be compared with the fluorescence intensity of an unknown sample to calculate the quantum yield of the unknown sample. Coumarin 153, Coumarin 545, Rhodamine 101 inner salt, Anthracene, and Rhodamine 6G may be used as standard dye, depending on their PL wavelengths, but are not limited thereto.

The quantum yield may be readily and reproducibly determined by using commercially available equipment (spectrophotometer), for example, from Hitachi Co. Ltd or Hamamatsu Co. Ltd and referring to the instruction manuals provided from the manufacturer. The quantum yield may be measured at room temperature (e.g., at a temperature of 20-30° C.).

The emission spectrum of the quantum dot may have a relatively narrow full width at half maximum (FWHM). Herein, the FWHM is a width of a wavelength range corresponding to half of the maximum emission point in the emission spectrum. By applying the quantum dot having an emission spectrum of a relatively narrow FWHM and the light emitting layer 13 including the same to the quantum dot device 10, high color purity (or color reproducibility) may be realized.

A FWHM of the quantum dot(s) can be readily or reproducibly measured a photoluminescent spectrum obtained by any commercially available equipment (spectrophotometer) for example, from Hitachi Co. Ltd or Hamamatsu Co. Ltd. The FWHM may be measured at room temperature (e.g., at a temperature of 20-30° C.).

The FWHM of the quantum dot (or light emitting layer 13) may be for example less than or equal to about 60 nm, within the range, for example, less than or equal to about 55 nm, less than or equal to about 52 nm, less than or equal to about 50 nm, less than or equal to about 49 nm, less than or equal to about 48 nm, less than or equal to about 47 nm, less than or equal to about 46 nm, less than or equal to about 45 nm, less than or equal to about 44 nm, less than or equal to about 43 nm, less than or equal to about 42 nm, less than or equal to about 41 nm, less than or equal to about 40 nm, less than or equal to about 39 nm, less than or equal to about 38 nm, less than or equal to about 37 nm, less than or equal to about 36 nm, less than or equal to about 35 nm, less than or equal to about 34 nm, less than or equal to about 33 nm, less than or equal to about 32 nm, less than or equal to about 31 nm, less than or equal to about 30 nm, less than or equal to about 29 nm, or less than or equal to about 28 nm, for example, about 2 nm to about 60 nm, about 2 nm to about 55 nm, about 2 nm to about 50 nm, about 2 nm to about 49 nm, about 2 nm to about 48 nm, about 2 nm to about 47 nm, about 2 nm to about 46 nm, about 2 nm to a 45 nm, about 2 nm to about 44 nm, about 2 nm to about 43 nm, about 2 nm to about 42 nm, about 2 nm to about 41 nm, about 2 nm to about 40 nm, about 2 nm to about 39 nm, about 2 nm to about 38 nm, about 2 nm to about 37 nm, about 2 nm to about 36 nm, about 2 nm to about 35 nm, about 2 nm to about 34 nm, about 2 nm to about 33 nm, about 2 nm to about 32 nm, about 2 nm to about 31 nm, about 2 nm to about 30 nm, about 2 nm to about 29 nm, or about 2 nm to about 28 nm.

For example, the quantum dot may include a Group II-VI semiconductor compound, a Group III-V semiconductor compound, a Group IV-VI semiconductor compound, a Group IV semiconductor compound, a Group I-III-VI semiconductor compound, a Group I-II-IV-VI semiconductor compound, a Group II-III-V semiconductor compound, or a combination thereof.

The Group II-VI semiconductor compound may be for example a binary element compound of CdSe, CdTe, ZnS, ZnSe, ZnTe, ZnO, HgS, HgSe, HgTe, MgSe, MgS, or a combination thereof; a ternary element compound of CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS, or a combination thereof; a quaternary element compound of HgZnTeS, CdZnSeS, CdZnSeTe, CdZnSTe, CdHgSeS, CdHgSeTe, CdHgSTe, HgZnSeS, HgZnSeTe, HgZnSTe, or a combination thereof; or a combination thereof, but is not limited thereto. The Group III-V semiconductor compound may be for example a binary element compound of GaN, GaP, GaAs, GaSb, AlN, AlP, AlAs, AlSb, InN, InP, InAs, InSb, or a combination thereof; a ternary element compound of GaNP, GaNAs, GaNSb, GaPAs, GaPSb, AlNP, AlNAs, AlNSb, AlPAs, AlPSb, InNP, InNAs, InNSb, InPAs, InPSb, or a combination thereof; a quaternary element compound of GaAlNP, GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, or a combination thereof; or a combination thereof, but is not limited thereto. The Group IV-VI semiconductor compound may be for example a binary element compound of SnS, SnSe, SnTe, PbS, PbSe, PbTe, or a combination thereof; a ternary element compound of SnSeS, SnSeTe, SnSTe, PbSeS, PbSeTe, PbSTe, SnPbS, SnPbSe, SnPbTe, or a combination thereof; a quaternary element compound of SnPbSSe, SnPbSeTe, SnPbSTe, or a combination thereof; or a combination thereof, but is not limited thereto. The Group IV semiconductor may be for example a single element semiconductor of Si, Ge, or a combination thereof; a binary element semiconductor compound of SiC, SiGe, or a combination thereof; or a combination thereof, but is not limited thereto. The Group I-III-VI semiconductor compound may be for example $CuInSe_2$, $CuInS_2$, CuInGaSe, CuInGaS, or a combination thereof, but is not limited thereto. The Group I-II-IV-VI semiconductor compound may be for example CuZnSnSe, CuZnSnS, or a combination thereof, but is not limited thereto. The Group II-III-V semiconductor compound may include for example InZnP, but is not limited thereto.

The quantum dot may include a single element semiconductor, a binary semiconductor compound, a ternary semiconductor compound, or a quaternary semiconductor compound in a substantially uniform concentration, or may be included in a state having a partially different concentration distribution.

For example, the quantum dot may include a cadmium (Cd)-free quantum dot. Cadmium (Cd) may cause severe environment/health problems and a restricted element by Restriction of Hazardous Substances Directive (RoHS) in a plurality of countries, and thus the non-cadmium-based quantum dot may be effectively used. In an example, the light emitting layer 13 may not include cadmium. An example of the light emitting layer 13 may not include cadmium, lead, mercury, or a combination thereof.

As an example, the quantum dot may be a semiconductor compound including zinc (Zn), and one of tellurium (Te) and selenium (Se). For example, the quantum dot may be a Zn—Te semiconductor compound, a Zn—Se semiconductor compound, a Zn—Te—Se semiconductor compound, or a combination thereof. For example, a mole fraction of tellurium (Te) in the Zn—Te—Se semiconductor compound may be smaller than a mole fraction of selenium (Se). The semiconductor compound may have a maximum emission wavelength in a wavelength spectrum of less than or equal to about 480 nm, for example, about 430 nm to about 480 nm, and may be configured to emit blue light.

For example, the quantum dot may be a semiconductor compound including indium (In) and zinc (Zn), phosphorus (P), or a combination thereof. For example, the quantum dot may be an In—P semiconductor compound, an In—Zn—P semiconductor compound, or a combination thereof. For example, in the In—Zn—P semiconductor compound, a mole ratio of zinc (Zn) to indium (In) may be greater than or equal to about 25:1.

The quantum dot may have a core-shell structure wherein one quantum dot surrounds another quantum dot. For example, the core and the shell of the quantum dot may have an interface, and an element of the core, the shell, or a combination thereof in the interface may have a concentration gradient wherein the concentration of the element(s) of the shell decreases toward the core. For example, a material composition of the shell of the quantum dot has a higher, e.g., greater, bandgap energy than a material composition of the core of the quantum dot, and thereby the quantum dot may exhibit a quantum confinement effect.

The quantum dot may have one quantum dot core and a multi-layered quantum dot shell surrounding the core. Herein, the multi-layered shell has at least two shells wherein each shell may be a single composition, be an alloy, have a concentration gradient, or a combination thereof.

For example, a shell of a multi-layered shell that is farther from the core may have a higher, e.g., greater, bandgap energy than a shell that is near, e.g., closer, to the core, and thereby the quantum dot may exhibit a quantum confinement effect.

For example, the quantum dot having a core-shell structure may for example include a core including a first semiconductor compound including zinc (Zn) and tellurium (Te), selenium (Se), or a combination thereof and a shell including a second semiconductor compound disposed on at least a portion of the core and having a different composition from that of the core.

For example, the first semiconductor compound may be a Zn—Te—Se-based semiconductor compound including zinc (Zn), tellurium (Te), and selenium (Se), for example, a Zn—Se-based semiconductor compound including a small amount of tellurium (Te), for example, a semiconductor compound represented by $ZnTe_xSe_{1-x}$, where x is greater than about 0 and less than or equal to 0.05.

For example, in the Zn—Te—Se-based first semiconductor compound, a mole fraction of zinc (Zn) may be higher, e.g., greater, than that of selenium (Se), and a mole fraction of selenium (Se) may be higher, e.g., greater, than that of tellurium (Te). For example, in the first semiconductor compound, a mole ratio of tellurium (Te) to selenium (Se) may be less than or equal to about 0.05:1, less than or equal to about 0.049:1, less than or equal to about 0.048:1, less than or equal to about 0.047:1, less than or equal to about 0.045:1, less than or equal to about 0.044:1, less than or equal to about 0.043:1, less than or equal to about 0.042:1, less than or equal to about 0.041:1, less than or equal to about 0.04:1, less than or equal to about 0.039:1, less than or equal to about 0.035:1, less than or equal to about 0.03:1, less than or equal to about 0.029:1, less than or equal to about 0.025:1, less than or equal to about 0.024:1, less than or equal to about 0.023:1, less than or equal to about 0.022:1, less than or equal to about 0.021:1, less than or equal to about 0.02:1, less than or equal to about 0.019:1, less than or equal to about 0.018:1, less than or equal to about 0.017:1, less than or equal to about 0.016:1, less than or equal to about 0.015:1, less than or equal to about 0.014:1, less than or equal to about 0.013:1, less than or equal to about 0.012:1, less than or equal to about 0.011:1, or less than or equal to about 0.01:1. For example, in the first semiconductor compound, a mole ratio of tellurium (Te) to zinc (Zn) may be less than or equal to about 0.02:1, less than or equal to about 0.019:1, less than or equal to about 0.018:1, less than or equal to about 0.017:1, less than or equal to about 0.016:1, less than or equal to about 0.015:1, less than or equal to about 0.014:1, less than or equal to about 0.013:1, less than or equal to about 0.012:1, less than or equal to about 0.011:1, or less than or equal to about 0.010:1.

The second semiconductor compound may include, for example, a Group II-VI semiconductor compound, a Group III-V semiconductor compound, a Group IV-VI semiconductor compound, a Group IV semiconductor compound, a Group semiconductor compound, a Group I-II-IV-VI semiconductor compound, a Group II-III-V semiconductor compound, or a combination thereof. Examples of the Group II-VI semiconductor compound, Group III-V semiconductor compound, Group IV-VI semiconductor compound, Group IV semiconductor compound, Group semiconductor compound, Group I-II-IV-VI semiconductor compound, and Group II-III-V semiconductor compound are the same as described herein.

For example, the second semiconductor compound may include zinc (Zn), selenium (Se), sulfur (S), or a combination thereof. For example, the shell may include ZnSeS, ZnS, or a combination thereof. For example, the shell may include an, e.g., at least one, inner shell disposed close to the core and an outermost shell disposed at the outermost side of the quantum dot. The inner shell may include ZnSeS and the outermost shell may include ZnS. For example, the shell may have a concentration gradient of one component and for example a content of sulfur (S) may increase in a direction away from the core.

For example, a quantum dot having a core-shell structure may include a core including a third semiconductor compound including indium (In) and zinc (Zn), phosphorus (P), or a combination thereof and a shell disposed on at least a portion of the core and including a fourth semiconductor compound having a composition different from the core.

In the In—Zn—P-based third semiconductor compound, a mole ratio of zinc (Zn) to indium (In) may be greater than or equal to about 25:1. For example, in the In—Zn—P-based third semiconductor compound, the mole ratio of zinc (Zn) to indium (In) may be greater than or equal to about 28:1, greater than or equal to about 29:1, or greater than or equal to about 30:1. For example, in the In—Zn—P-based third semiconductor compound, the mole ratio of zinc (Zn) to indium (In) may be less than or equal to about 55:1, for example less than or equal to about 50:1, less than or equal to about 45:1, less than or equal to about 40:1, less than or equal to about 35:1, less than or equal to about 34:1, less than or equal to about 33:1, or less than or equal to about 32:1.

The fourth semiconductor compound may include, for example, a Group II-VI semiconductor compound, a Group III-V semiconductor compound, a Group IV-VI semiconductor compound, a Group IV semiconductor compound, a Group I-III-VI semiconductor compound, a Group I-II-IV-VI semiconductor compound, a Group II-III-V semiconductor compound, or a combination thereof. Examples of the Group II-VI semiconductor compound, Group III-V semiconductor compound, Group IV-VI semiconductor compound, Group IV semiconductor compound, Group I-III-VI semiconductor compound, Group I-II-IV-VI semiconductor compound, and Group II-III-V semiconductor compound are the same as described herein.

For example, the fourth semiconductor compound may include zinc (Zn) and sulfur (S) and optionally selenium (Se). For example, the shell may include ZnSeS, ZnS, or a combination thereof. For example, the shell may include an, e.g., at least one, inner shell disposed close to the core and an outermost shell disposed at the outermost side of the quantum dot. The inner shell, the outermost shell, or a combination thereof may include a fourth semiconductor compound of ZnS, or ZnSeS.

The aforementioned quantum dots are commercially available or may be appropriately synthesized.

In the quantum dot device 10 of an example, the quantum dot(s) may include a first organic ligand on the surface thereof. The first organic ligand may have a hydrophobic moiety. The first organic ligand may be bound to the surface of the quantum dot. The first organic ligand may include RCOOH, $RNH_2$, $R_2NH$, $R_3N$, RSH, $R_3PO$, $R_3P$, ROH, RCOOR, $RPO(OH)_2$, RHPOOH, $R_2POOH$, or a combination thereof, wherein R is each independently a substituted or unsubstituted C3 to C40 aliphatic hydrocarbon group (e.g., a C5 to C40 aliphatic hydrocarbon group) such as a substituted or unsubstituted C3 to C40 alkyl, alkenyl, etc., a substituted or unsubstituted C6 to C40 aromatic hydrocarbon group such as a substituted or unsubstituted C6 to C40 aryl group, etc., or a combination thereof.

Examples of the organic ligand may be a thiol compound such as methane thiol, ethane thiol, propane thiol, butane thiol, pentane thiol, hexane thiol, octane thiol, dodecane thiol, hexadecane thiol, octadecane thiol, benzyl thiol, and the like; an amine such as methane amine, ethane amine, propane amine, butane amine, pentyl amine, hexyl amine, octyl amine, nonylamine, decylamine, dodecyl amine, hexadecyl amine, octadecyl amine, dimethyl amine, diethyl amine, dipropyl amine, tributylamine, trioctylamine, and the like; a carboxylic acid compound such as methanoic acid, ethanoic acid, propanoic acid, butanoic acid, pentanoic acid, hexanoic acid, heptanoic acid, octanoic acid, dodecanoic acid, hexadecanoic acid, octadecanoic acid, oleic acid, benzoic acid, and the like; a phosphine compound such as methyl phosphine, ethyl phosphine, propyl phosphine, butyl phosphine, pentyl phosphine, octylphosphine, dioctyl phosphine, tributylphosphine, trioctylphosphine, and the like; a phosphine compound or an oxide compound thereof such as methyl phosphine oxide, ethyl phosphine oxide, propyl phosphine oxide, butyl phosphine oxide pentyl phosphine oxide, tributylphosphine oxide, octylphosphine oxide, dioctyl phosphine oxide, trioctylphosphine oxide; diphenyl phosphine, tri phenyl phosphine compound or an oxide compound thereof; a C5 to C20 alkylphosphinic acid such as hexylphosphinic acid, octylphosphinic acid, dodecanephosphinic acid, tetradecanephosphinic acid, hexadecanephosphinic acid, octadecanephosphinic acid, a C5 to C20 alkyl phosphonic acid such as hexylphosphonic acid, octylphosphonic acid, dodecane phosphonic acid, tetradecane phosphonic acid, hexadecane phosphonic acid, octadecane phosphonic acid; and the like, but are not limited thereto. The quantum dots may include a hydrophobic organic ligand alone or in a mixture of two or more typed hydrophobic organic ligand.

The quantum dots may include a halogen together with an organic ligand (e.g., C5 or higher, e.g., greater, for example, C10 or higher, e.g., greater, fatty acid compound, e.g., oleic acid) on the surface (hereinafter referred to as "halogen-treated quantum dots"). The content of halogen in halogen-treated quantum dots may be, for example, greater than or equal to about 1 microgram (μg), greater than or equal to about 1.5 μg, greater than or equal to about 3 μg, greater than or equal to about 4 μg, greater than or equal to about 5 μg, greater than or equal to about 6 μg, greater than or equal to about 7 μg, greater than or equal to about 8 μg, greater than or equal to about 9 μg, greater than or equal to about 10 μg, greater than or equal to about 11 μg, greater than or equal to about 12 μg, greater than or equal to about 12.5 μg, greater than or equal to about 13 μg, greater than or equal to about 14 μg, greater than or equal to about 15 μg, greater than or equal to about 16 μg, greater than or equal to about 17 μg, greater than or equal to about 18 μg, or greater than or equal to about 19 μg and less than about 30 μg, less than or equal to about 25 μg, less than or equal to about 20 μg, less than or equal to about 19.5 μg, less than or equal to about 19 μg, less than or equal to about 18 μg, less than or equal to about 17 μg, less than or equal to about 15 μg, less than or equal to about 12.5 μg, or less than or equal to about 12 μg, per milligram (mg) of quantum dots, when confirmed by ion chromatography. The halogen may be chlorine.

An example of a method of preparing the halogen-treated quantum dots may include obtaining an organic dispersion including a plurality of quantum dots including a first organic ligand on the surface and a first organic solvent; obtaining a chloride solution including a polar organic solvent miscible with the first organic solvent and a metal halide; and adding the chloride solution to the organic dispersion so that the content of the metal halide is greater than or equal to about 0.1 weight percent (wt %) and less than or equal to about 10 wt %, based on the total weight of the quantum dots, and then stirring the resultant at a temperature of greater than or equal to about 45° C., for example, greater than or equal to about 50° C., greater than or equal to about 55° C., or greater than or equal to about 60° C. and less than or equal to about 150° C., less than or equal to about 140° C., less than or equal to about 100° C., less than or equal to about 90° C., less than or equal to about 80° C., or less than or equal to about 70° C. A volume ratio of the polar organic solvent to the first organic solvent may be less than or equal to about 0.1:1.

The metal halide (e.g., metal chloride) may include a zinc halide, an indium halide, a gallium halide, a magnesium halide, a lithium halide, or a combination thereof. The first organic solvent may include a substituted or unsubstituted C5 to C40 aliphatic hydrocarbon, a substituted or unsubstituted C6 to C40 aromatic hydrocarbon, a substituted or unsubstituted C3 to C40 alicyclic hydrocarbon, or a combination thereof. The polar organic solvent may include a C1 to C10 alcohol (e.g., methanol, ethanol, propanol, isopropanol, butanol, pentanol, hexanol, heptanol, etc.) or a combination thereof.

A thickness of the light emitting layer 13 may be, for example, about 5 nm to about 200 nm, and within the disclosed range, for example, about 10 nm to about 150 nm, for example, about 20 nm to about 100 nm, for example, about 20 nm to about 80 nm.

The light emitting layer 13 may have a single layer or a multilayer structure in which two or more layers are stacked. In the multilayer structure, adjacent layers (e.g., the first light emitting layer and the second light emitting layer) may have different physical properties/compositions. A light emitting layer 13, e.g., at least one of the light emitting layers 13, of an example may further include a halogen (e.g., chlorine). The light emitting layer 13 of an example may exhibit a halogen content that changes in a thickness direction.

An example of the light emitting layer 13 may include a layer (hereinafter, referred to as a surface-treated first light emitting layer or a first layer) including quantum dots and having a surface treated with halogen (e.g., chlorine). A second layer including the halogen-treated quantum dots, a third layer including quantum dots having organic ligands, or a combination thereof may be disposed on the first layer. The second layer may be disposed between the first layer and the third layer. The organic material (e.g., carbon) content (e.g., concentration) of the first layer may be lower, e.g., less, than the organic material content of the second layer. The halogen (e.g., chlorine) content (e.g., concentration) of the first layer may be higher, e.g., greater, than the halogen content of the second layer. The organic material content of the first layer may be higher, e.g., greater, than the organic material content of the second layer. The halogen content of the first layer may be lower, e.g., less, than the organic material content of the second layer. The organic material content of the light emitting layer 13 may be controlled by an appropriate means (post-treatment for the formed layer).

The light emitting layer 13 may have a relatively deep HOMO energy level, for example, a HOMO energy level of greater than or equal to about 5.4 eV, for example greater than or equal to about 5.6 eV, within the range, for example greater than or equal to about 5.7 eV, for example greater than or equal to about 5.8 eV, for example greater than or equal to about 5.9 eV, for example greater than or equal to about 6.0 eV. The HOMO energy level of the light emitting layer 13 may be, within the disclosed range, for example, about 5.4 eV to about 7.0 eV, for example, about 5.4 eV to about 6.8 eV, for example, about 5.4 eV to about 6.7 eV, for example, about 5.4 eV to about 6.5 eV, for example, about 5.4 eV to about 6.3 eV, for example, about 5.4 eV to about 6.2 eV, for example, about 5.4 eV to about 6.1 eV, within the disclosed range, for example, about 5.6 eV to about 7.0 eV, for example, about 5.6 eV to about 6.8 eV, for example, about 5.6 eV to about 6.7 eV, for example, about 5.6 eV to about 6.5 eV, for example, about 5.6 eV to about 6.3 eV, for example, about 5.6 eV to about 6.2 eV, for example, about 5.6 eV to about 6.1 eV, within the disclosed range, for example, about 5.7 eV to about 7.0 eV, for example, about 5.7 eV to about 6.8 eV, for example, about 5.7 eV to about 6.7 eV, for example, about 5.7 eV to about 6.5 eV, for example, about 5.7 eV to about 6.3 eV, for example, about 5.7 eV to about 6.2 eV, for example, about 5.7 eV to about 6.1 eV, within the disclosed range, for example, about 5.8 eV to about 7.0 eV, for example, about 5.8 eV to about 6.8 eV, for example, about 5.8 eV to about 6.7 eV, for example, about 5.8 eV to about 6.5 eV, for example, about 5.8 eV to about 6.3 eV, for example, about 5.8 eV to about 6.2 eV, for example, about 5.8 eV to about 6.1 eV, within the disclosed range, for example, about 6.0 eV to about 7.0 eV, for example, about 6.0 eV to about 6.8 eV, for example, about 6.0 eV to about 6.7 eV, for example, about 6.0 eV to about 6.5 eV, for example, about 6.0 eV to about 6.3 eV, for example, about 6.0 eV to about 6.2 eV.

The light emitting layer 13 may have a relatively shallow LUMO energy level, for example, less than or equal to about 3.6 eV, within the disclosed range, for example, less than or equal to about 3.5 eV, for example, less than or equal to about 3.4 eV, for example, less than or equal to about 3.3 eV, for example, less than or equal to about 3.2 eV, or for example, less than or equal to about 3.0 eV. Within the range, the LUMO energy level of the light emitting layer 13 may be about 2.5 eV to about 3.6 eV, about 2.5 eV to about 3.5 eV, for example, about 2.5 eV to about 3.4 eV, for example, about 2.5 eV to about 3.3 eV, for example, about 2.5 eV to about 3.2 eV, for example, about 2.5 eV to about 3.1 eV, for example, about 2.5 eV to about 3.0 eV, for example, about 2.8 eV to about 3.6 eV, about 2.8 eV to about 3.5 eV, for example, about 2.8 eV to about 3.4 eV, for example, about 2.8 eV to about 3.3 eV, for example, about 2.8 eV to about 3.2 eV, about 3.0 eV to about 3.6 eV, about 3.0 eV to about 3.5 eV, or for example, about 3.0 eV to about 3.4 eV.

The light emitting layer 13 may have a bandgap energy of about 2.4 eV to about 2.9 eV. Within the disclosed range, it may have a bandgap energy, for example, about 2.4 eV to about 2.8 eV, within the disclosed range, for example, about 2.4 eV to about 2.78 eV.

The first hole auxiliary layer 14 and the second hole auxiliary layer 15 are disposed between the first electrode 11 and the light emitting layer 13. The first hole auxiliary layer 14 may be close to the light emitting layer 13 between the first electrode 11 and the light emitting layer 13, and the second hole auxiliary layer 15 may be close to the first electrode 11 between the first electrode 11 and the light emitting layer 13.

For example, the first hole auxiliary layer 14 may be in contact with the light emitting layer.

For example, the second hole auxiliary layer 15 may be in contact with the first electrode 11.

For example, the first hole auxiliary layer 14 and the second hole auxiliary layer 15 may be in contact with each other.

The first hole auxiliary layer 14 may be a functional layer for improving electrical performance between the first electrode 11 and the light emitting layer 13, and in particular, for increasing the transport of holes from the first electrode 11 to the light emitting layer 13 and blocking reverse injection of electrons from the light emitting layer 13 to the first electrode 11. For example, the first hole auxiliary layer 14 may be a hole transport layer, an electron blocking layer, or a combination thereof.

The first hole auxiliary layer 14 may include a plurality of hole auxiliary materials. The plurality of hole auxiliary materials may be blended, e.g., intermixed, in the first hole auxiliary layer 14 and may be blended substantially uniformly.

The hole auxiliary material may include, for example, a first hole auxiliary material and a, e.g., at least one, second hole auxiliary material having different electrical characteristics from the first hole auxiliary material. Each of the first hole auxiliary material and the second hole auxiliary material may have conduction characteristics according to the HOMO energy level when an electric field is applied. The HOMO energy level of the first hole auxiliary material may be between the work function of the first electrode 11 and the HOMO energy level of the light emitting layer 13, and the HOMO energy level of the second hole auxiliary material may be between the work function of the first electrode and the HOMO energy level of the light emitting layer.

The first hole auxiliary material may provide a main transport path of holes in the first hole auxiliary layer 14 and the second hole auxiliary material may provide an auxiliary transport path of holes in the first hole auxiliary layer 14.

The HOMO energy level of the first hole auxiliary material and the HOMO energy level of the second hole auxiliary material may each have a relatively deep HOMO energy level to match the HOMO energy level of the light emitting layer 13. Accordingly, the mobility of holes transferred from the first hole auxiliary layer 14 to the light emitting layer 13 may be increased.

The HOMO energy level of the first hole auxiliary material may be equal to or shallower, e.g., less, than the HOMO energy level of the light emitting layer 13 in a range of less than or equal to about 1.0 eV. For example, the difference between the HOMO energy level of the first hole auxiliary material and the HOMO energy level of the light emitting layer 13 may be about 0 eV to about 1.0 eV, within the disclosed range, for example, about 0.01 eV to about 0.8 eV, within the disclosed range, for example, about 0.01 eV to about 0.7 eV, within the disclosed range, for example, about 0.01 eV to about 0.5 eV, within the disclosed range, for example, about 0.01 eV to about 0.4 eV, for example, about 0.01 eV to about 0.3 eV, for example, about 0.01 eV to about 0.2 eV, for example, about 0.01 eV to about 0.1 eV.

The HOMO energy level of the first hole auxiliary material may be, for example, greater than or equal to about 5.0 eV, and within this range, for example, greater than or equal to about 5.1 eV, for example, greater than or equal to about 5.2 eV, greater than or equal to about 5.4 eV, or for example, greater than or equal to about 5.6 eV. The HOMO energy level of the first hole auxiliary material may be, for example, about 5.0 eV to about 6.5 eV, within the disclosed range, for example, about 5.1 eV to about 6.5 eV, for example, about 5.2 eV to about 6.5 eV, for example, about 5.4 eV to about 6.5 eV, for example, about 5.6 eV to about 6.5 eV, for example, about 5.8 eV to about 6.5 eV, for example, about 5.1 eV to about 6.2 eV, for example, about 5.2 eV to about 6.2 eV, for example, about 5.4 eV to about 6.2 eV, for example, about 5.6 eV to about 6.2 eV, for example, about 5.8 eV to about 6.2 eV, for example, about 5.1 eV to about 6.0 eV, for example, about 5.2 eV to about 6.0 eV, for example, about 5.4 eV to about 6.0 eV, for example, about 5.6 eV to about 6.0 eV, for example, about 5.8 eV to about 6.0 eV, for example, about 5.1 eV to about 5.8 eV, for example, about 5.2 eV to about 5.8 eV, for example, about 5.4 eV to about 5.8 eV, for example, about 5.2 eV to about 5.6 eV, or for example, about 5.3 eV to about 5.5 eV.

The second hole auxiliary material may have a HOMO energy level that is shallower, e.g., less, or deeper, e.g., greater, than that of the first hole auxiliary material, and a difference between the HOMO energy level of the second hole auxiliary material and the HOMO energy level of the first hole auxiliary material may be greater than about 0 eV and less than about 0.8 eV. Within the disclosed range, the difference between the HOMO energy level of the second hole auxiliary material and the HOMO energy level of the first hole auxiliary material may be greater than or equal to about 0.1 eV and less than about 0.8 eV, for example, about 0.1 eV to about 0.7 eV, about 0.1 eV to about 0.6 eV, about 0.1 eV to about 0.5 eV, about 0.1 eV to about 0.4 eV, or about 0.1 eV to about 0.3 eV.

The HOMO energy level of the second hole auxiliary material may be shallower, e.g., less, than the HOMO energy level of the first hole auxiliary material by greater than about 0 eV and less than or equal to about 0.8 eV. Within the disclosed range, the HOMO energy level of the second hole auxiliary material may be shallower, e.g., less, than the HOMO energy level of the first hole auxiliary material by greater than or equal to about 0.1 eV and less than about 0.8 eV, for example, about 0.1 eV to about 0.7 eV, about 0.1 eV to about 0.6 eV, about 0.1 eV to about 0.5 eV, about 0.1 eV to about 0.4 eV, or about 0.1 eV to about 0.3 eV.

For example, the HOMO energy level of the second hole auxiliary material may be greater than or equal to about 4.8 eV and less than about 5.4 eV, within the disclosed range, for example, about 4.9 eV to about 5.3 eV, about 5.0 eV to about 5.3 eV, or about 5.1 eV to about 5.3 eV.

As described herein, since the second hole auxiliary material has a HOMO energy level in the disclosed range compared to that of the first hole auxiliary material, it is possible to provide a smooth hole transport path together with the aforementioned first hole auxiliary material. That is, the first hole auxiliary material may provide a main transport path of holes and the second hole auxiliary material may provide an auxiliary transport path of holes to provide a plurality of hole transport paths. Accordingly, it is possible to prevent deterioration of the first hole auxiliary layer 14 compared to the case of a single hole transport path by a single hole auxiliary material, thereby improving the life-span characteristics of the quantum dot device 10. In addition, the second hole auxiliary material is blended with the first hole auxiliary material in the first hole auxiliary layer 14 to effectively passivate defects in the first hole auxiliary material, which may provide a main transport path of holes when the quantum dot device 10 is driven. Accordingly, it is possible to effectively reduce deterioration such as hysteresis by securing current stability of holes moving from the first electrode 11 to the light emitting layer 13.

Meanwhile, a LUMO energy level of the second hole auxiliary material may be shallower, e.g., less, than that of the first hole auxiliary material. For example, the difference between the LUMO energy level of the second hole auxiliary material and the LUMO energy level of the first hole auxiliary material is greater than or equal to about 0.3 eV. For example, the LUMO energy level of the second hole auxiliary material may be shallower, e.g., less, than the LUMO energy level of the first hole auxiliary material by greater than or equal to about 0.4 eV, greater than or equal to about 0.5 eV, or greater than or equal to about 0.6 eV, for example, about 0.3 eV to about 2.0 eV, about 0.4 eV to about 2.0 eV, about 0.5 eV to about 2.0 eV, about 0.6 eV to about 2.0 eV, about 0.3 eV to about 1.8 eV, about 0.4 eV to about 1.8 eV, about 0.5 eV to about 1.8 eV, about 0.6 eV to about 1.8 eV, about 0.3 eV to about 1.5 eV, about 0.4 eV to about 1.5 eV, about 0.5 eV to about 1.5 eV, about 0.6 eV to about 1.5 eV, about 0.3 eV to about 1.2 eV, about 0.4 eV to about 1.2 eV, about 0.5 eV to about 1.2 eV, about 0.6 eV to about 1.2 eV, about 0.3 eV to about 1.0 eV, about 0.4 eV to about 1.0 eV, about 0.5 eV to about 1.0 eV, or about 0.6 eV to about 1.0 eV.

For example, the LUMO energy level of the first hole auxiliary material may be greater than or equal to about 2.0 eV, within the disclosed range, greater than or equal to about 2.1 eV, greater than or equal to about 2.2 eV, for example, greater than or equal to about 2.3 eV, or greater than or equal to about 2.4 eV. The LUMO energy level of the first hole auxiliary material may be, for example, about 2.0 eV to about 4.0 eV, within the disclosed range, for example, about 2.1 eV to about 4.0 eV, for example, about 2.2 eV to about 4.0 eV, for example for example, about 2.3 eV to about 4.0 eV, for example, about 2.4 eV to about 4.0 eV, for example, about 2.0 eV to about 3.5 eV, for example, about 2.1 eV to about 3.5 eV, for example, about 2.2 eV to about 3.5 eV, for example, about 2.3 eV to about 3.5 eV, for example, about 2.4 eV to about 3.5 eV, for example, about 2.0 eV to about 3.0 eV, for example, about 2.1 eV to about 3.0 eV, for example, about 2.2 eV to about 3.0 eV, for example, about 2.3 eV to about 3.0 eV, for example, about 2.4 eV to about 3.0 eV, for example, about 2.0 eV to about 2.8 eV, for example, about 2.1 eV to about 2.8 eV, for example, about 2.2 eV to about 2.8 eV, for example, about 2.3 eV to about 2.8 eV, for example, about 2.4 eV to about 2.8 eV, for example, about 2.0 eV to about 2.6 eV, for example, about 2.1 eV to about 2.6 eV, for example, about 2.2 eV to about 2.6 eV, for example, about 2.3 eV to about 2.6 eV, or for example, about 2.4 eV to about 2.6 eV.

For example, the LUMO energy level of the second hole auxiliary material may be less than or equal to about 2.0 eV, within the disclosed range, for example, less than or equal to about 1.9 eV, for example, less than or equal to about 1.8 eV, for example, less than or equal to about 1.7 eV, within the disclosed range, for example, about 1.2 eV to about 2.0 eV, for example, about 1.2 eV to about 1.9 eV, for example, about 1.2 eV to about 1.8 eV, for example, about 1.2 eV to about 1.7 eV, for example, about 1.5 eV to about 2.0 eV, for example, about 1.5 eV to about 1.9 eV, for example, about 1.5 eV to about 1.8 eV, for example, about 1.5 eV to about 1.7 eV, for example, about 1.6 eV to about 2.0 eV, for example, about 1.6 eV to about 1.9 eV, or for example, about 1.6 eV to about 1.8 eV.

As such, the second hole auxiliary material has a LUMO energy level in the disclosed range compared to the first hole auxiliary material, thereby forming an energy barrier between the light emitting layer 13 and the first hole auxiliary layer 14 to prevent and block excess electrons that are not recombined in the light emitting layer 13 from passing through the light emitting layer 13. Accordingly, the electrons injected from the second electrode 12 are confined in the light emitting layer 13 to improve electrical performance and light emitting performance, and at the same time to prevent deterioration of the quantum dot device 10 due to excess electrons passing through the light emitting layer 13 and to prevent deterioration of the life-span characteristics can be improved.

If the first hole auxiliary layer 14 does not provide an energy barrier due to the aforementioned second hole auxiliary material, excess electrons passing through the light emitting layer 13 may also pass through the first hole auxiliary layer 14 and may flow into the second hole auxiliary layer 15 described herein, the first electrode 11, or a combination thereof. Considering the narrow bandgap energy of the second hole auxiliary layer 15 and the work function of the first electrode 11, electrical deterioration due to excess electrons rapidly progresses to adversely affect the electrical and life-span characteristics of the quantum dot device 10.

The first hole auxiliary layer 14, together with the first hole transport material providing the main transport path of holes, as described herein, may provide an auxiliary transport path for holes and may effectively passivate defects of the first hole transport material. At the same time, by including the second hole transport material capable of effectively blocking excess electrons, deterioration of the quantum dot device may be reduced or prevented, thereby improving life-span characteristics.

The second hole auxiliary material may have a wider, e.g., greater, bandgap energy than the first hole auxiliary material by having the aforementioned HOMO energy level and LUMO energy level compared to the first hole auxiliary material. For example, the bandgap energy of the second hole auxiliary material may be wider, e.g., greater, than that of the first hole auxiliary material greater than or equal to about 0.5 eV, for example, about 0.5 eV to about 1.5 eV, about 0.5 eV to about 1.2 eV, or about 0.5 eV to about 1.0 eV.

For example, the bandgap energy of the second hole auxiliary material may be greater than or equal to about 3.0 eV, within the disclosed range, greater than or equal to about 3.2 eV, greater than or equal to about 3.4 eV, or greater than or equal to about 3.5 eV, for example, about 3.0 eV to about 4.0 eV, about 3.2 eV to about 4.0 eV, about 3.4 eV to about 4.0 eV, about 3.5 eV to about 4.0 eV, about 3.0 eV to about 3.8 eV, about 3.2 eV to about 3.8 eV, or about 3.4 eV to about 3.8 eV.

For example, the bandgap energy of the first hole auxiliary material may be less than or equal to about 3.3 eV and within the disclosed range, for example, about 2.4 eV to about 3.3 eV, for example, about 2.5 eV to about 3.3 eV, for example, about 2.6 eV to about 3.3 eV, for example, about 2.4 eV to about 3.2 eV, for example, about 2.5 eV to about 3.2 eV, for example, about 2.6 eV to about 3.2 eV, for example, about 2.4 eV to about 3.0 eV, for example, about 2.5 eV to about 3.0 eV or for example, about 2.6 eV to about 3.0 eV.

Each of the first hole auxiliary material and the second hole auxiliary material may be a material satisfying the aforementioned energy level, and may each independently be, for example, a low weight molecular semiconductor, a polymer semiconductor, or a combination thereof, for example, a semiconductor polymer. For example, the first hole auxiliary material and the second hole auxiliary material may be a polymer semiconductor soluble in a solvent (the same solvent) for a solution process to be described herein. Here, the solvent may be, for example, an organic solvent such as xylene (e.g., ortho-xylene), but is not limited thereto.

For example, the first hole auxiliary material may include, for example, N,N,N',N'-tetrakis(4-methoxyphenyl)-benzidine (TPD); N,N'-bis(1-naphthyl)-N, N'-diphenyl-(1,1'-biphenyl)-4,4'-diamine (NPD); 4,4',4"-tris[phenyl(m-tolyl)amino]triphenylamine) (m-MTDATA); 4,4',4"-tris(N-carbazolyl)-triphenylamine (TCTA), 1,1-bis[(di-4-tolylamino)phenyl]cyclohexane (TAPC), N2,N7-di(naphthalen-1-yl)-9,9-dioctyl-N2,N7-diphenyl-9H-fluorene-2,7-diamine (NPB); 2,7-bis(carbazol-9-yl)-9,9-spirobifluorene (spiro-2CBP); 2,2',7,7'-tetra(N,N-di-p-tolyl)amino-9,9-spirobifluorene (spiro-TTB); 2,2',7,7'-tetrakis(N,N-diphenylamino)-9,9-spirobifluorene (spiro-TAD); 1,1-bis[(di-4-tolylamino)phenyl]cyclohexane (TAPC), 4,4'-bis(N-carbazolyl)-1,1'-biphenyl (CBP); 4,4',4"-tris[2-naphthyl(phenyl)amino]triphenylamine (2-TNATA); 1,3,5-tris(4-diphenylaminophenyl)benzene (TDAPB); a polymer including a fluorene moiety and a triphenylamine moiety, such as poly(9,9-dioctyl-fluorene-co-N-(4-butylphenyl)-diphenylamine (TFB); a polymer including a carbazole moiety, such as poly(N-vinylcarbazole); polyaniline, polypyrrole, or a combination thereof, but is not limited thereto.

For example, the second hole auxiliary material may be a material satisfying the energy level described herein with respect to the first hole auxiliary material. The second hole auxiliary material may be, for example, an amine-based polymer, for example, a polymer including a triphenylamine moiety and, for example, a polymer including a triphenylamine moiety having a weight average molecular weight of about 7,000 to about 10,000.

A thickness of the first hole auxiliary layer 14 may be less than or equal to about 80 nm, for example, about 5 nm to about 80 nm, about 5 nm to about 70 nm, or about 5 nm to about 60 nm.

The second hole auxiliary layer 15 may be a functional layer that facilitates injection of holes from the first electrode 11. The HOMO energy level of the second hole auxiliary layer 15 may be between the work function of the first electrode 11 and the HOMO energy level of the first hole transport material of the first hole auxiliary layer 14. The second hole auxiliary layer 15 may have a narrow bandgap energy compared to the first hole auxiliary layer 14, and for example, the bandgap energy of the second hole auxiliary layer 15 may be less than or equal to about 0.5 eV, less than or equal to about 0.3 eV, less than or equal to about 0.2 eV, or less than or equal to about 0.1 eV, within the disclosed range, about 0.01 eV to about 0.5 eV, about 0.01 eV to about 0.4 eV, about 0.01 eV to about 0.3 eV or about 0.01 eV to about 0.2 eV. The second hole auxiliary layer 15 may include a material satisfying the aforementioned energy level, for example, poly(3,4-ethylenedioxythiophene) (PEDOT), poly(3,4-ethylenedioxythiophene) polystyrene sulfonate (PEDOT:PSS), but is not limited thereto.

A thickness of the second hole auxiliary layer 15 may be less than or equal to about 50 nm, for example, about 2 nm to about 50 nm, about 2 nm to about 40 nm, or about 2 nm to about 30 nm.

The electron auxiliary layer 16 may be disposed between the second electrode 12 and the light emitting layer 13 and may have one layer or two or more layers. For example, one surface of the electron auxiliary layer 16 may be in contact with the second electrode 12, and the other surface of the electron auxiliary layer 16 may be in contact with the light emitting layer 13.

The electron auxiliary layer 16 may be a functional layer that improves electrical performance between the second electrode 12 and the light emitting layer 13, and may increase transport of electrons from the second electrode 12 to the light emitting layer 13, and may block reverse injection of holes from the light emitting layer 13 to the second electrode 12. For example, the electron auxiliary layer 16 may be an electron transport layer, a hole blocking layer, or a combination thereof.

For example, the electron auxiliary layer 16 may include inorganic nanoparticles as an electron transport material. The inorganic nanoparticles may be, for example, oxide nanoparticles, such as metal oxide nanoparticles. For example, the inorganic nanoparticles may be metal oxide nanoparticles including two or more types of metals. For example, the inorganic nanoparticles may be inorganic semiconductors. For example, the inorganic nanoparticles may be n-type inorganic nanoparticles.

The inorganic nanoparticles may be two-dimensional or three-dimensional nanoparticles having an average particle diameter of less than or equal to about 10 nm, within the disclosed range, less than or equal to about 8 nm, less than or equal to about 7 nm, less than or equal to about 5 nm, less than or equal to about 4 nm, or less than or equal to about 3.5 nm, within the disclosed range, about 1 nm to about 10 nm, about 1 nm to about 9 nm, about 1 nm to about 8 nm, about 1 nm to about 7 nm, about 1 nm to about 5 nm, about 1 nm to about 4 nm, or about 1 nm to about 3.5 nm.

The LUMO energy level of the inorganic nanoparticles (or the electron auxiliary layer 16) may be deeper, e.g., greater, or shallower, e.g., less, than the LUMO energy level of the light emitting layer 13, for example, it may be deeper, e.g., greater, than the LUMO energy level of the light emitting layer 13. The difference between the LUMO energy level of the inorganic nanoparticles (or the electron auxiliary layer 16) and the LUMO energy level of the light emitting layer 13 may be less than or equal to about 2.5 eV, and within the disclosed range, less than or equal to about 2.3 eV, less than or equal to about 2.0 eV, or less than or equal to about 1.8 eV. The LUMO energy level of the inorganic nanoparticles (or the electron auxiliary layer 16) may be, for example, about 2.5 eV to about 4.8 eV, and within the disclosed range, for example, about 2.6 eV to about 4.6 eV or about 2.7 eV to about 4.5 eV.

The HOMO energy level of the inorganic nanoparticles (or the electron auxiliary layer 16) may be deeper, e.g., greater, than, for example, the HOMO energy level of the light emitting layer 13. For example, the HOMO energy level of the inorganic nanoparticles (or the electron auxiliary layer 16) may be deeper, e.g., greater, than the HOMO energy level of the light emitting layer 13 by greater than or equal to about 0.2 eV, greater than or equal to about 0.5 eV, greater than or equal to about 0.8 eV, greater than or equal to about 1.0 eV, greater than or equal to about 1.2 eV, or greater than or equal to about 1.5 eV, for example, about 0.2 eV to about 3.0 eV, about 0.5 eV to about 3.0 eV, about 0.8 eV to about 3.0 eV, about 1.0 eV to about 3.0 eV, about 1.2 eV to about 3.0 eV, or about 1.5 eV to about 3.0 eV.

For example, the inorganic nanoparticles (or the electron auxiliary layer 16) may have a relatively deep HOMO energy level, and the HOMO energy level of the inorganic nanoparticles (or the electron auxiliary layer 16) may be, for example, about 5.6 eV to about 8.5 eV, within the range, about 5.8 eV to about 8.2 eV, about 6.0 eV to about 8.0 eV, about 6.2 eV to about 8.0 eV, about 6.5 eV to about 8.0 eV, about 6.8 eV to about 8.0 eV, about 7.0 eV to about 8.0 eV, about 7.2 eV to about 7.9 eV, or about 7.3 eV to about 7.8 eV. The inorganic nanoparticles (or the electron auxiliary layer 16) may effectively block the reverse injection of holes from the light emitting layer 13 by having a relatively deep HOMO energy level as described herein, and may improve stability of the quantum dot device 10.

The inorganic nanoparticles may be a material satisfying the aforementioned energy level, for example, a metal oxide nanoparticle including zinc (Zn), magnesium (Mg), cobalt (Co), nickel (Ni), gallium (Ga), aluminum (Al), calcium (Ca), zirconium (Zr), tungsten (W), lithium (Li), titanium (Ti), tantalum (Ta), tin (Sn), hafnium (Hf), barium (Ba), or a combination thereof.

For example, the inorganic nanoparticles may include metal oxide nanoparticles including zinc (Zn), for example, metal oxide nanoparticles expressed as $Zn_{1-x}Q_xO$ ($0 \le x < 0.5$). Here, Q may include a metal other than Zn, such as magnesium (Mg), cobalt (Co), nickel (Ni), gallium (Ga), aluminum (Al), calcium (Ca), zirconium (Zr), W), lithium (Li), titanium (Ti), tantalum (Ta), tin (Sn), hafnium (Hf), silicon (Si), barium (Ba), or a combination thereof.

For example, Q may include magnesium (Mg).

For example, x may satisfy the range of $0.01 \le x \le 0.4$, $0.01 \le x \le 0.3$, or $0.01 \le x \le 0.2$.

The electron auxiliary layer 16 may further include an alkali metal, an alkali metal compound, or a combination thereof, in addition to the aforementioned inorganic nanoparticles. The alkali metal, alkali metal compound, or combination thereof may be included in the form of a mixture with the aforementioned inorganic nanoparticles, and may be included in a limited amount in the electron auxiliary layer 16 to effectively improve the electrical characteristics of the electron auxiliary layer 16.

The alkali metal, alkali metal compound, or combination thereof may be included in the form of, for example, an alkali metal cation, an alkali metal cation derived from an alkali metal compound, or a combination thereof. The alkali metal compound may be a compound including an alkali metal, for example, alkali carbonate, alkali phosphate, alkali vanadate, alkali azide, alkali nitride, or a combination thereof.

The alkali metal or alkali metal included in the alkali metal compound may be, for example, lithium (Li), sodium (Na), potassium (K), cesium (Cs), rubidium (Rb), francium (Fr) or a combination thereof. These lithium (Li), sodium (Na), potassium (K), cesium (Cs), rubidium (Rb), or francium (Fr) may be included in a form of a lithium cation, a sodium cation, a potassium cation, a cesium cation, a rubidium cation, or a francium cation, respectively.

The alkali metal compound (e.g., alkali metal salt) may further include an anion such as carbonate ($CO_3^{2-}$), phosphate ($PO_4^{3-}$), vanadate ($VO_4^{3-}$), azide ($N_3^-$), or nitride ($N^{3-}$), together with the alkali metal cation.

For example, the alkali metal may be lithium (Li), sodium (Na), potassium (K), cesium (Cs), rubidium (Rb), francium (Fr), or a combination thereof, and the alkali metal compound may be cesium carbonate ($Cs_2CO_3$), cesium phosphate ($Cs_3PO_4$), cesium vanadate ($Cs_3VO_4$), cesium azide ($CsN_3$), lithium carbonate ($LiCO_3$), lithium nitride ($Li_3N$), sodium carbonate ($Na_2CO_3$), potassium carbonate ($K_2CO_3$), rubidium carbonate ($Rb_2CO_3$), or a combination thereof, but is not limited thereto.

In the electron auxiliary layer 16, the total alkali metal derived from the alkali metal, alkali metal compound, or combination thereof may be included in a less amount than inorganic nanoparticles. For example, the total alkali metal derived from the alkali metal, alkali metal compound, or combination thereof may be included in an amount of about 0.1 volume percent (vol %) to about 30 vol %, within the disclosed range, about 0.1 vol % to about 25 vol %, about 0.1 vol % to about 20 vol %, about 0.5 vol % to about 18 vol %, about 1 vol % to about 15 vol %, or about 3 vol % to about 15 vol %, based on the electron auxiliary layer 16. For example, the total alkali metal derived from the alkali metal, alkali metal compound, or combination thereof may be included in an amount of less than about 0.5 atomic percent (at %), based on the total number of atoms included in the electron auxiliary layer 16.

A thickness of the electron auxiliary layer 16 may be less than or equal to about 80 nm, for example, about 10 nm to about 80 nm, about 15 nm to about 60 nm, or about 15 nm to about 40 nm.

A method for manufacturing the aforementioned quantum dot device 10 includes forming a first electrode 11 on a substrate (not shown), forming a second hole auxiliary layer 15, forming a first hole auxiliary layer 14, forming a light emitting layer 13, forming an electron auxiliary layer 16, and forming a second electrode 12.

The light emitting layer 13, the first and second hole auxiliary layers 14 and 15, the electron auxiliary layer 16, or a combination thereof may be formed by a solution process, for example, spin coating, slit coating, inkjet printing, nozzle printing, spraying, doctor blade coating, or a combination thereof, but is not limited thereto.

For example, the forming of the first hole auxiliary layer 14 may include coating a blended solution of the aforementioned first hole auxiliary material and second hole auxiliary material. For example, the blended solution may be prepared by blending a solution including the first hole auxiliary material and a solution including the second hole auxiliary material, or the blended solution may be prepared by mixing the first hole auxiliary material and the second hole auxiliary material in a solvent.

At least a portion of each process of the forming of the light emitting layer 13, the first and second hole auxiliary layers 14 and 15, the electron auxiliary layer 16, or a combination thereof may further include optionally drying, heat treating, or a combination thereof after the solution process, and the heat-treating may be performed, for example, at about 50° C. to about 300° C. for about 1 minute to about 10 hours, but the present disclosure is not limited thereto.

The aforementioned quantum dot device 10 may be applied to, e.g., used in, various electronic devices such as, for example, a display device or a lighting device. For example, the aforementioned quantum dot device 10 may be applied to, e.g., used in, various electronic devices emitting light, for example, may be applied to, e.g., used in, various electronic devices such as a display device such as a television (TV), a monitor, a computer, a mobile, etc., or a lighting device such as a light source.

Hereinafter, the embodiments are illustrated in more detail with reference to examples. However, these examples are exemplary, and the scope of claims is not limited thereto.

Synthesis of Quantum Dot Dispersion

Synthesis Example 1: Synthesis of Blue Light Emitting Quantum Dots 1

(1) Synthesis of ZnTeSe Core Quantum Dot Dispersion

Selenium (Se) and tellurium (Te) are respectively dispersed in trioctylphosphine (TOP) to obtain a 2 molar (moles per liter (M)) Se/TOP stock solution and a 0.1 M Te/TOP stock solution.

0.125 millimoles (mmol) of zinc acetate is put with 0.25 mmol of oleic acid and 0.25 mmol of hexadecylamine and 10 milliliters (mL) of trioctylamine in a reactor and then, heated under vacuum at 120° C. After 1 hour, an atmosphere in the reactor is converted into nitrogen.

After heating the reactor at 240° C., the Se/TOP stock solution and the Te/TOP stock solution in a Te:Se mole ratio of 1:25 are rapidly injected thereinto. The reaction solution is heated up to 300° C., maintained for 30 minutes, and then, rapidly cooled down to room temperature, acetone is added thereto, and precipitates obtained therefrom through centrifugation are dispersed in toluene to obtain ZnTeSe core quantum dot dispersion.

(2) Synthesis of ZnTeSe Core/ZnSeS Shell Quantum Dot Dispersion

Trioctylamine is put in a 10 mL flask. Subsequently, 0.6 mmol of zinc acetate and 1.2 mmol of oleic acid are added thereto and then, vacuum-treated at 120° C. for 10 minutes. Then, the flask is internally substituted with nitrogen ($N_2$), the ZnTeSe core quantum dot dispersion is rapidly injected thereinto, and the 2 M Se/TOP and the 1 M S/TOP in a Se:S mole ratio of 1.2:2.8 are injected thereinto and then, heated up to 340° C. to perform a reaction. When the reaction is complete, the reactor is cooled down, nanocrystals are centrifuged with ethanol and then, dispersed in toluene to obtain ZnTeSe core/ZnSeS shell quantum dot dispersion.

Synthesis Example 2: Synthesis of Blue Light Emitting Quantum Dots 2

Zinc chloride is dissolved in ethanol to obtain a zinc chloride solution at a concentration of 10 weight percent (wt %). 0.01 mL of the zinc chloride solution is added to the ZnTeSe core/ZnSeS shell quantum dot dispersion according to Synthesis Example 1 and then, stirred at 60° C. for 30 minutes to perform a surface exchange reaction. After the reaction, ethanol is added thereto to induce precipitation, which is followed by centrifugation, and this process is several times repeated to obtain halogenated ZnTeSe core/ZnSeS shell quantum dot dispersion.

Synthesis of Inorganic Nanoparticle

Synthesis Example 3

0.93 millimoles (mmol) of magnesium acetate tetrahydrate, 8.07 mmol of zinc acetate dehydrate, and 90 mL of dimethylsulfoxide are added to a reactor and heated under air at 60° C. 15 mmol of tetramethylammonium hydroxide pentahydrate is dissolved in 30 mL of ethanol, and the solution is added slowly to the reactor at 3 mL per minute in a dropwise fashion. Following the complete addition of the hydroxide the reaction mixture is stirred for 1 hour. The prepared $Zn_{0.85}Mg_{0.15}O$ nanoparticles and ethyl acetate are centrifuged in a volume ratio of 1:9 and dispersed in ethanol to obtain a $Zn_{0.85}Mg_{0.15}O$ nanoparticle dispersion. The average particle diameter of $Zn_{0.85}Mg_{0.15}O$ nanoparticles measured with UT F30 Tecnai electron microscope is about 3.0 nm.

Preparation of Hole Auxiliary Solution

Preparation Example 1

0.8 milligrams (mg) of Polymer A-1 (poly[(9,9-dioctylfluorenyl-2,7-diyl-co-(4,4'-(N-4-butylphenyl)diphenylamine], TFB) having energy levels shown in Table 1 is added to 1 mL of ortho-xylene and then, stirred with a magnetic bar overnight (6 hours or more) to prepare a Polymer A-1 solution. Herein, the energy levels are measured in a thin film state.

0.8 mg of Polymer B (an amine-based polymer) having energy levels shown in Table 1 is added to 1.0 mL of ortho-xylene and then, stirred with a magnetic bar overnight (6 hours or more) to prepare a Polymer B solution.

Subsequently, the Polymer A-1 solution and the Polymer B solution are blended in a volume ratio of 3:1 to prepare a solution for an upper hole auxiliary layer.

Preparation Example 2

A solution for an upper hole auxiliary layer is prepared by using Polymer A-2 having energy levels shown in Table 1 instead of Polymer A-1 to prepare a Polymer A-2 solution and then, mixing the Polymer A-2 solution and the Polymer B solution in a volume ratio of 3:1.

Preparation Example 3

A solution for an upper hole auxiliary layer is prepared by using Polymer A-3 having an energy level shown in Table 1 instead of Polymer A-1 to prepare a Polymer A-3 solution and then, mixing the Polymer A-3 solution and the Polymer B solution in a volume ratio of 4:1.

Preparation Example 4

A solution for an upper hole auxiliary layer is prepared by using Polymer A-3 having an energy level shown in Table 1 instead of Polymer A-1 to prepare a Polymer A-3 solution and then, mixing the Polymer A-3 solution and the Polymer B solution in a volume ratio of 3:1.

Preparation Example 5

A solution for an upper hole auxiliary layer is prepared by using Polymer A-3 having an energy level shown in Table 1 instead of Polymer A-1 to prepare a Polymer A-3 solution and then, mixing the Polymer A-3 solution and the Polymer B solution in a volume ratio of 2:1.

Comparative Preparation Example 1

A solution for an upper hole auxiliary layer including the Polymer A-1 solution alone is prepared.

Comparative Preparation Example 2

A solution for an upper hole auxiliary layer including the Polymer A-2 solution alone is prepared.

Comparative Preparation Example 3

A solution for an upper hole auxiliary layer including the Polymer A-3 solution alone is prepared.

TABLE 1

| | | Highest Occupied Molecular Orbital (HOMO) (electronvolts (eV)) | Lowest Unoccupied Molecular Orbital (LUMO) (eV) | Eg (eV) |
|---|---|---|---|---|
| First hole auxiliary material | Polymer A-1 | 5.45 | 2.59 | 2.86 |
| | Polymer A-2 | 5.34 | 2.52 | 2.82 |
| | Polymer A-3 | 5.52 | 2.66 | 2.86 |
| Second hole auxiliary material | Polymer B | 5.20 | 1.70 | 3.50 |

* Eg: Bandgap energy
* HOMO, LUMO: Absolute value

Preparation of Electron Auxiliary Solution

Preparation Example 6

0.06 mg of $Rb_2CO_3$ is added to 6 mL of ethanol and then, stirred overnight (6 hours or more) to prepare a $Rb_2CO_3$ solution (at a concentration of 0.01 milligrams per milliliter (mg/mL)). Subsequently, the $Zn_{0.85}Mg_{0.15}O$ nanoparticle dispersion obtained in Synthesis Example 3 and the $Rb_2CO_3$ solution are blended in a volume ratio of 5:1 to prepare dispersion for an electron auxiliary layer.

Manufacture of Blue Light Emitting Quantum Dot Device I

Example 1

A glass substrate deposited with indium tin oxide (ITO) (work function (WF): 4.8 eV) is surface-treated with ultraviolet (UV)-ozone for 15 minutes, spin-coated with a poly (3,4-ethylenedioxythiophene) polystyrene sulfonate (PEDOT:PSS) solution (H.C. Starks), heat-treated under an air atmosphere at 150° C. for 10 minutes, and heat-treated again under a $N_2$ atmosphere at 150° C. for 30 minutes to form a 30 nm-thick lower hole transport layer (HOMO: 5.3 eV, LUMO: 2.7 eV). Subsequently, the solution for an upper hole auxiliary layer according to Preparation Example 1 is spin-coated on the lower hole auxiliary layer and then heat-treated at 150° C. for 30 minutes to form a 25 nm-thick upper hole auxiliary layer. Subsequently, the halogenated ZnTeSe/ZnSeS core-shell quantum dot dispersion (a peak emission wavelength: 453 nm) according to Synthesis Example 2 is spin-coated on the upper hole auxiliary layer and then, heat-treated at 80° C. for 30 minutes to form a 25 nm-thick lower quantum dot layer (HOMO: 5.9 eV, LUMO: 3.2 eV). On the lower quantum dot layer, the (halogenated) ZnTeSe/ZnSeS core-shell quantum dot dispersion according to Synthesis Example 2 is spin-coated and heat-treated at 80° C. for 30 minutes to form a 25 nm-thick upper quantum dot layer. Subsequently, the dispersion for an electron auxiliary layer according to Preparation Example 6 is spin-coated on the upper quantum dot layer and heat-treated at 80° C. for 30 minutes to form a 40 nm-thick electron auxiliary layer. On the electron auxiliary layer, aluminum (Al) is vacuum-deposited to form a 100 nm-thick second electrode (WF: 4.2 eV), manufacturing a quantum dot device.

Comparative Example 1

A quantum dot device is manufactured according to the same method as Example 1 except that the solution for an upper hole auxiliary layer of Comparative Preparation Example 1 is used instead of the solution for an upper hole auxiliary layer according to Preparation Example 1 to form an upper hole auxiliary layer.

Example 2

A quantum dot device is manufactured according to the same method as Example 1 except that the solution for an upper hole auxiliary layer according to Preparation Example 2 is used instead of the solution for an upper hole auxiliary layer according to Preparation Example 1 to form an upper hole auxiliary layer.

Comparative Example 2

A quantum dot device is manufactured according to the same method as Example 2 except that the solution for an upper hole auxiliary layer of Comparative Preparation Example 2 is used instead of the solution for an upper hole auxiliary layer according to Preparation Example 2 to form an upper hole auxiliary layer.

Example 3

A quantum dot device is manufactured according to the same method as Example 1 except that the solution for an upper hole auxiliary layer according to Preparation Example 3 is used instead of the solution for an upper hole auxiliary layer according to Preparation Example 1 to form an upper hole auxiliary layer.

Example 4

A quantum dot device is manufactured according to the same method as Example 1 except that the solution for an upper hole auxiliary layer according to Preparation Example 4 is used instead of the solution for an upper hole auxiliary layer according to Preparation Example 1 to form an upper hole auxiliary layer.

Comparative Example 3

A quantum dot device is manufactured according to the same method as Example 3 except that the solution for an upper hole auxiliary layer of Comparative Preparation Example 3 is used instead of the solution for an upper hole auxiliary layer according to Preparation Example 3 to form an upper hole auxiliary layer.

Evaluation I

Luminance and life-span characteristics of the quantum dot devices of Examples 1-4 and Comparative Examples 1-3 are evaluated.

The luminance is evaluated by measuring density-voltage-luminance (J-V-L) characteristics with a luminance meter (CS-2000).

The life-span characteristics are evaluated from a luminance decrease relative to initial luminance, while supplying a current that meets a condition that a quantum dot device exhibits luminance of 650 nit (candelas per square meter), and $T_{90}$ is relatively evaluated by comparing time that the quantum dot devices of Examples 1-4 show 90% of luminance relative to the initial luminance with that of each quantum dot device of Comparative Example 1, 2, or 3 as a reference (ref.).

The results are shown in Tables 2 to 4.

TABLE 2

| | Maximum Luminance ($Lum_{max}$) | $T_{90}$ |
|---|---|---|
| Example 1 | 1.0 | 1.17 |
| Comparative Example 1 | 1.0 (ref.) | 1.00 (ref.) |

* $Lum_{max}$: Relative value based on maximum luminance of Comparative Example 1
* $T_{90}$: Relative value based on time to show 90% of luminance with respect to the initial luminance of Comparative Example 1

TABLE 3

| | $Lum_{max}$ | $T_{90}$ |
|---|---|---|
| Example 2 | 1.08 | 1.77 |
| Comparative Example 2 | 1.00 (ref.) | 1.00 (ref.) |

TABLE 4

| | $T_{90}$ |
|---|---|
| Example 3 | 1.71 |
| Example 4 | 2.25 |
| Comparative Example 3 | 1.00 (ref.) |

Referring to Tables 2 to 4, the quantum dot devices of Examples 1-4 exhibit improved life-span while showing equivalent or improved light emitting characteristics, compared with the quantum dot devices of Comparative Examples 1-3.

Manufacture of Blue Light Emitting Quantum Dot Device II

Example 5

A glass substrate deposited with ITO (WF: 4.8 eV) is surface-treated with UV-ozone for 15 minutes, spin-coated with a PEDOT:PSS solution (H.C. Starks), heat-treated under an air atmosphere at 150° C. for 10 minutes, and heat-treated again under a $N_2$ atmosphere at 150° C. for 30 minutes to form a 30 nm-thick lower hole transport layer (HOMO: 5.3 eV, LUMO: 2.7 eV). Subsequently, the solution for an upper hole auxiliary layer according to Preparation Example 3 is spin-coated on the lower hole auxiliary layer and heat-treated at 150° C. for 30 minutes to form a 25 nm-thick upper hole auxiliary layer. On the upper hole auxiliary layer, the halogenated ZnTeSe/ZnSeS core-shell quantum dot dispersion (a peak emission wavelength: 453 nm) according to Synthesis Example 2 is spin-coated and heat-treated at 80° C. 30 minutes to form a 25 nm-thick quantum dot layer (HOMO: 5.9 eV, LUMO: 3.2 eV). Subsequently, a 30 nm-thick electron auxiliary layer including a bis-carbazole-based compound is formed on the quantum dot layer, and aluminum (Al) is vacuum-deposited to be 100 nm thick to form a second electrode (WF: 4.2 eV), manufacturing a quantum dot device.

Example 6

A quantum dot device is manufactured according to the same method as Example 5 except that the solution for an upper hole auxiliary layer according to Preparation Example 4 instead of the solution for an upper hole auxiliary layer according to Preparation Example 3 is used to form an upper hole auxiliary layer.

Example 7

A quantum dot device is manufactured according to the same method as Example 5 except that the solution for an upper hole auxiliary layer according to Preparation Example 5 instead of the solution for an upper hole auxiliary layer according to Preparation Example 3 is used to form an upper hole auxiliary layer.

Comparative Example 5

A quantum dot device is manufactured according to the same method as Example 5 except that the solution for an upper hole auxiliary layer of Comparative Preparation Example 3 instead of the solution for an upper hole auxiliary layer according to Preparation Example 3 is used to form an upper hole auxiliary layer.

Evaluation II

Current stability of the quantum dot devices of Examples 5 to 7 and Comparative Example 5 is evaluated.

The current stability is evaluated from hysteresis, and specifically, the hysteresis is calculated by measuring a change of current density, while applying a forward bias/a reverse bias by a unit of 0.5 volts (V) within a range of 2 V to 12 V and then, using the following Calculation Equation.

Hysteresis Calculation Equation $|(\text{Area F}-\text{Area R})|/\text{Area F}\times 100\%$ Area F is an area of a curve in a voltage-current density graph when the forward bias is applied, and Area R is an area of a curve in a voltage-current density graph when the reverse bias is applied.

The results are shown in Table 5.

TABLE 5

| | Area F | Area R | Hysteresis (%) |
|---|---|---|---|
| Example 5 | 521 | 920 | 77 |
| Example 6 | 749 | 1266 | 69 |
| Example 7 | 1299 | 2078 | 60 |
| Comparative Example 5 | 489 | 940 | 92 |

Referring to Table 5, the quantum dot devices of Examples 5-7 exhibit a decrease of the hysteresis, compared with the quantum dot device of Comparative Example 5, and accordingly, as the second hole auxiliary material is included in a higher, e.g., greater, content, e.g., a greater content ratio relative to a content of the first hole auxiliary material, in the upper hole auxiliary layer, the hysteresis decrease becomes larger, e.g., greater.

While this disclosure has been described in connection with what is presently considered to be practical example embodiments, it is to be understood that the invention is not limited to the disclosed embodiments. On the contrary, it is intended to cover various modifications and equivalent arrangements included within the spirit and scope of the appended claims.

What is claimed is:

1. A quantum dot device, comprising a first electrode and a second electrode, a light emitting layer between the first electrode and the second electrode, the light emitting layer comprising quantum dots, and a first hole auxiliary layer between the first electrode and the light emitting layer, wherein the first hole auxiliary layer comprises a first hole auxiliary material, and a second hole auxiliary material having a greater bandgap energy than a bandgap energy of the first hole auxiliary material, wherein a difference between a highest occupied molecular orbital energy level of the second hole auxiliary material and a highest occupied molecular orbital energy level of the first hole auxiliary material is 0.1 electronvolts to less than 0.8 electronvolts, a difference between a lowest unoccupied molecular orbital energy level of the second hole auxiliary material and a lowest unoccupied molecular orbital energy level of the first hole auxiliary material is greater than or equal to 0.3 electronvolts, the highest occupied molecular orbital energy level of the second hole auxiliary material is less than the highest occupied molecular orbital energy level of the first hole auxiliary material, the highest occupied molecular orbital energy level of the first hole auxiliary material is 5.1 electronvolts to 5.6 electonvolts, the lowest unoccupied molecular orbital energy level of the second hole auxiliary material is less than the lowest unoccupied molecular orbital energy level of the first hole auxiliary material, the first hole auxiliary layer comprises less of the second hole auxiliary material than the first hole auxiliary material on a mole basis, each of the first hole auxiliary material and the second hole auxiliary material is a polymer semiconductor, the second hole auxiliary material comprising the polymer semiconductor comprising a triphenylamine moiety, and the lowest unoccupied molecular orbital energy level of the second hole auxiliary material is 1.2 electronvolts to 2.0 electronvolts.

2. The quantum dot device of claim 1, wherein the first hole auxiliary material and the second hole auxiliary material are blended in the first hole auxiliary layer.

3. The quantum dot device of claim 1, wherein the highest occupied molecular orbital energy level of the first hole auxiliary material is between a work function of the first electrode and a highest occupied molecular orbital energy level of the light emitting layer, and the highest occupied molecular orbital energy level of the second hole auxiliary material is between the work function of the first electrode and the highest occupied molecular orbital energy level of the light emitting layer.

4. The quantum dot device of claim 1, wherein the highest occupied molecular orbital energy level of the second hole auxiliary material is 4.8 electronvolts to less than 5.4 electronvolts.

5. The quantum dot device of claim 1, wherein the lowest unoccupied molecular orbital energy level of the first hole auxiliary material is 2.4 electronvolts to 2.8 electronvolts.

6. The quantum dot device of claim 1, wherein the bandgap energy of the second hole auxiliary material is 0.5 electronvolts to 1.2 electronvolts greater than the bandgap energy of the first hole auxiliary material.

7. The quantum dot device of claim 1, wherein the highest occupied molecular orbital energy level of the second hole auxiliary material is 5.0 electronvolts to less than 5.4 electronvolts, and the lowest unoccupied molecular orbital energy level of the second hole auxiliary material is 1.5 electronvolts to 1.9 electronvolts, respectively.

8. The quantum dot device of claim 7, wherein the bandgap energy of the second hole auxiliary material is greater than or equal to 3.0 electronvolts.

9. The quantum dot device of claim 1, wherein the first hole auxiliary material and the second hole auxiliary material are soluble in the same solvent.

10. The quantum dot device of claim 1, wherein a mole ratio of the second hole auxiliary material to the first hole auxiliary material in the first hole auxiliary layer is 0.01:1 to 0.8:1.

11. The quantum dot device of claim 1, further comprising a second hole auxiliary layer between the first electrode and the first hole auxiliary layer.

12. An electronic device comprising the quantum dot device of claim 1.

13. A quantum dot device, comprising a first electrode and a second electrode, a light emitting layer between the first electrode and the second electrode, the light emitting layer comprising quantum dots, a first hole auxiliary layer between the first electrode and the light emitting layer, the first hole auxiliary layer comprising a mixture of a first hole auxiliary material and a second hole auxiliary material, and a second hole auxiliary layer between the first electrode and the first hole auxiliary layer, wherein the first hole auxiliary layer comprises less of the second hole auxiliary material than the first hole auxiliary material on a mole basis, each of the first hole auxiliary material and the second hole auxiliary material is a polymer semiconductor, the second hole auxiliary material comprising the polymer semiconductor comprising a triphenylamine moiety, a highest occupied molecular orbital energy level of the first hole auxiliary material is 5.1 electronvolts to 5.6 electonvolts, a highest occupied molecular orbital energy level of the second hole auxiliary material is 5.0 electronvolts to less than 5.4 electronvolts, a lowest unoccupied molecular orbital energy level of the second hole auxiliary material is 1.5 electronvolts to 1.9 electronvolts, and a bandgap energy of a second hole auxiliary material is 0.5 electronvolts to 1.2 electronvolts greater than the bandgap energy of the first hole auxiliary material.

14. The quantum dot device of claim 13, wherein a mole ratio of the first hole auxiliary material and the second hole auxiliary material in the first hole auxiliary layer is 2:1 to 5:1.

15. The quantum dot device of claim 13, wherein a lowest unoccupied molecular orbital energy level of the first hole auxiliary material is 2.4 electronvolts to 2.8 electronvolts.

16. The quantum dot device of claim 13, wherein the first hole auxiliary material comprises the polymer semiconductor comprising a triphenylamine moiety.

17. An electronic device comprising the quantum dot device of claim 13.

* * * * *